United States Patent [19]

Copeland, III et al.

[11] 4,438,447
[45] Mar. 20, 1984

[54] MULTILAYERED OPTICAL INTEGRATED CIRCUIT

[75] Inventors: John A. Copeland, III, Fair Haven; Stewart E. Miller, Locust, both of N.J.

[73] Assignee: Bell Telephone Laboratories, Incorporated, Murray Hill, N.J.

[21] Appl. No.: 339,849

[22] Filed: Jan. 18, 1982

[51] Int. Cl.³ .................................................. H01L 31/12
[52] U.S. Cl. ........................................ 357/19; 357/16; 357/17; 357/30; 357/40; 357/41
[58] Field of Search .................... 357/19, 16, 17, 30 G, 357/30, 40, 41

[56] References Cited

U.S. PATENT DOCUMENTS

| | | | |
|---|---|---|---|
| 3,465,159 | 9/1969 | Stern | 357/19 X |
| 3,978,426 | 8/1976 | Logan et al. | 357/16 X |
| 3,993,963 | 11/1976 | Logan et al. | 357/16 X |
| 4,136,928 | 1/1979 | Logan et al. | 357/19 X |
| 4,152,044 | 5/1979 | Liu | 357/19 X |

OTHER PUBLICATIONS

Lee et al., "GaAs-GaAlAs Heterojunction Lasers on Semi-Insulating Substrates", *IEEE Trans. on Elec. Dev.*, vol. ED-25, No. 10, 10/10/78, pp. 1250-1256.
Wilt et al., "Low Threshold be Implanted (GaAl) as Laser on Semi-Insulating Substrate", *IEE Journal of Quantum Elec.*, vol. QE-16, No. 4, 4/4/80, pp. 390-391.

*Primary Examiner*—Martin H. Edlow
*Assistant Examiner*—W. Mintel
*Attorney, Agent, or Firm*—Daniel D. Dubosky

[57] ABSTRACT

An electro-optic integrated circuit is disclosed wherein the long electrical connections normally present on a large scale integrated circuit are replaced by an optical waveguide layer. A plurality of epitaxial layers are grown on a single substrate and at least three of the plurality of epitaxial layers are grown with bandgaps that are suitable for optical sources, detectors and waveguiding. These primary layers are separated from each other by a barrier layer having a bandgap greater than either of the adjacent primary layers. Two of the layers adjacent to the substrate are grown to accommodate electrical devices that can be used to couple electrical signals to the optical source layers and to amplify electrical signals provided by the optical detection layer.

15 Claims, 6 Drawing Figures

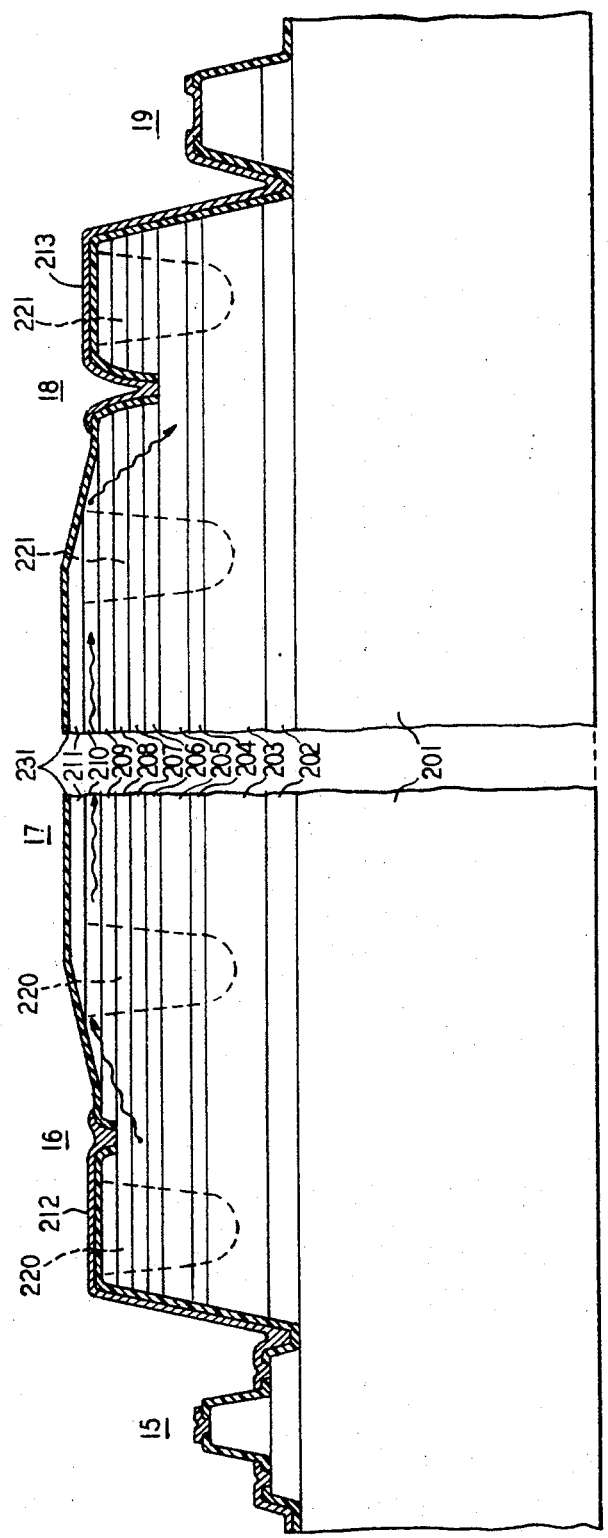

FIG. 5

MULTILAYERED OPTICAL INTEGRATED CIRCUIT, USING $In_{1-x}Ga_xAs_yP_{1-y}$

| LAYER | | | DOPING | | THICKNESS (μm) | COMPOSITION | | BAND ENERGY |
|---|---|---|---|---|---|---|---|---|
| NO. | DESCRIPTION | TYPE | CONCENTRATION ($cm^{-3}$) | DOPANT | | %Ga (100x) | %As (100y) | |
| 201 | SUBSTRATE | I | $10^{17}$ | Fe | 100 | 0 | 0 | 1.35 |
| 202 | FET CHANNEL | n | $10^{16}$ | Sn | 1.0 | 47 | 100 | 0.75 |
| 203 | BUFFER | $p^+$ | $10^{18}$ | Cd | 3.0 | 0 | 0 | 1.35 |
| 204 | SECONDARY | $n^+$ | $10^{18}$ | Sn | 0.5 | 0 | 0 | 1.35 |
| 205 | PRIMARY (DETECTOR) | $n^-$ | $10^{16}$ | Sn | 1.0 | 32 | 68 | 0.95 |
| 206 | SECONDARY | $p^+$ | $10^{18}$ | Cd | 0.3 | 0 | 0 | 1.35 |
| 207 | PRIMARY (SOURCE) | p | $10^{17}$ | Mg | 0.3 | 24 | 50 | 1.05 |
| 208 | SECONDARY | n | $10^{17}$ | Sn | 0.2 | 12 | 25 | 1.20 |
| 209 | GUIDE CLADDING | $n^-$ | $10^{16}$ | Sn | 1.0 | 0 | 0 | 1.35 |
| 210 | PRIMARY (GUIDE) | n | $10^{16}$ | Sn | 0.5 | 12 | 25 | 1.20 |
| 211 | GUIDE CLADDING | n | $10^{16}$ | Sn | 1.0 | 0 | 0 | 1.35 |

MULTILAYERED OPTICAL INTEGRATED CIRCUIT

BACKGROUND OF THE INVENTION

High speed logic circuits are being manufactured in larger and more complicated semiconductor chips. Presently, these semiconductor chips are constructed entirely of electronic devices. If these chips continue to be completely electronic, the speed with which these chips can manipulate external signals will be limited by the time required to send electrical signals from one part of the chip to another. The RC time constant of the driving device and the relatively long connecting conductor on the chip will be the primary factors in determining the speed of the chip. A large scale high speed integrated circuit can be made to operate much faster if the signals on the chip were transmitted by way of an optical signal. In essence the conductor can be replaced by an optical waveguide with an optical source or emitter at one end of the waveguide and a detector at the other end.

SUMMARY OF THE INVENTION

A high speed, multilayered optical integrated circuit is provided in accordance with the present invention wherein at least three separate groups of semiconductor layers are fabricated on a substrate and each group is optimized to perform one of the following three optical device functions: emission, transmission or detection. Each group of layers has a primary layer and one or more secondary layers above and below it with the possible exception that the topmost primary layer might lie on the surface of the device. The secondary layers have a larger bandgap energy and hence a lower index of refraction than the primary layer of the same group. In the embodiment disclosed, a single layer serves as the secondary layer for two groups of layers thereby acting as a secondary layer for a primary layer both above and below the given layer.

The three primary layers, used to provide optical emission, optical transmission and optical detection, have a very specific relationship between their bandgap energies. The primary layer used to provide optical waveguiding or transmission is fabricated such that this layer has the largest bandgap energy $E_1$. The primary layer used to provide optical emission is caused to have a bandgap energy $E_2$ that is less than $E_1$. Finally, the primary layer that is used to provide optical detection is fabricated to have a bandgap energy $E_3$ that is less than the bandgap energy of the primary layer that provides optical emission. These requirements can be expressed by the following mathematical relationship: $E_1 > E_2 > E_3$.

In the embodiment disclosed, the invention is constructed in a semiconductor chip fabricated in the InGaAsP materials system. Two additional layers are initially grown on the indium phosphide substrate in order to permit the fabrication of FET devices that are used to energize the optical source and to amplify the detected optical systems. In other embodiments, the electrical devices may be fabricated from layers that are used as primary and secondary layers of the optical portion of the semiconductor device.

BRIEF DESCRIPTION OF THE DRAWING

The invention will be more readily understood after reading the following detailed description taken in conjunction with the drawing wherein:

FIG. 2 is a cross-sectional view of a multilayered optical integrated circuit constructed in accordance with the present invention, FIG. 5 is a table of semiconductor layers shown in FIG. 2 giving the composition of each of these layers.

DETAILED DESCRIPTION

Figure 1:
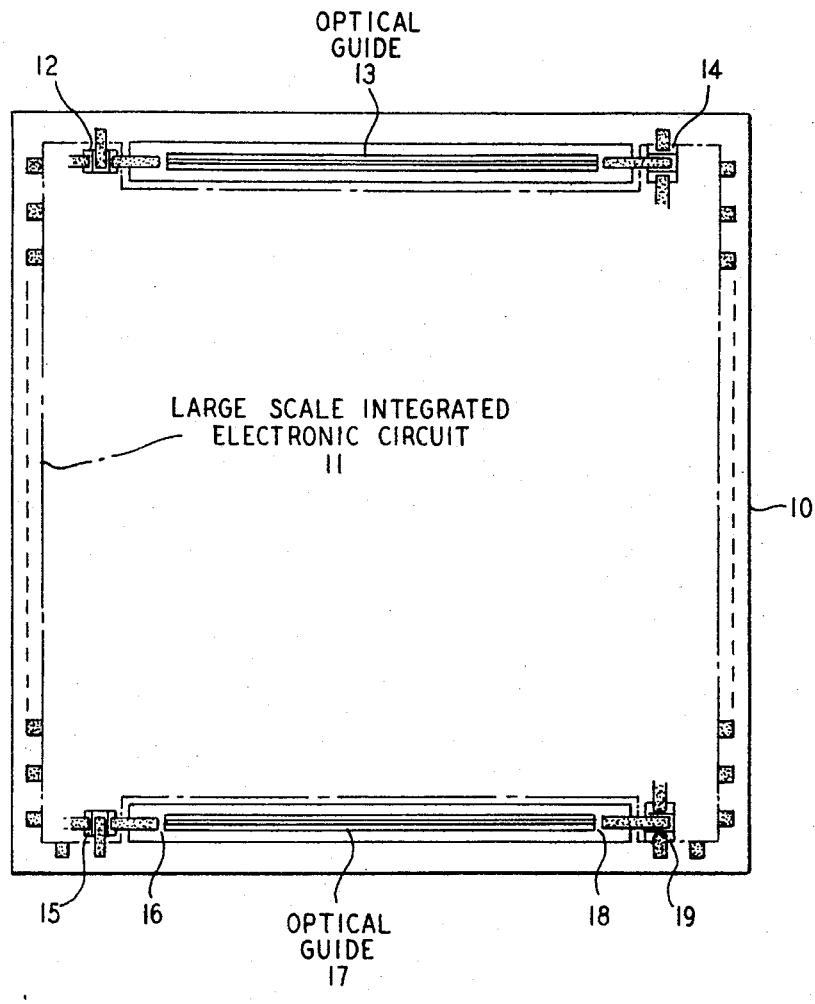
FIG. 1 is a pictorial top view of a multilayered optical integrated circuit that uses the present invention.

A semiconductor chip 10 on which a large scale integrated electronic circuit 11 has been fabricated is shown in FIG. 1. As indicated in FIG. 1, a field effect transistor 15 can be used to electrically couple a signal on the chip to a light emitting device 16 which in turn converts this electrical signal into an optical signal. The optical signal is coupled by way of an optical waveguide 17 to a photodetector 18 which, in turn, provides an electrical signal to the gate of a field effect transistor 19. In this way, an electrical signal from the lower left-hand portion of the semiconductor chip 10 may be rapidly coupled to the lower right-hand portion of the semiconductor chip. The combination of optical and electronic circuitry on a single semiconductor device has already been labeled by those skilled in the art as the technical area photonics. Similar electro-optical couplings of one part of the chip to another can be provided by other sources, waveguides and detectors in other areas of the semiconductor chip 10.

Figure 4:
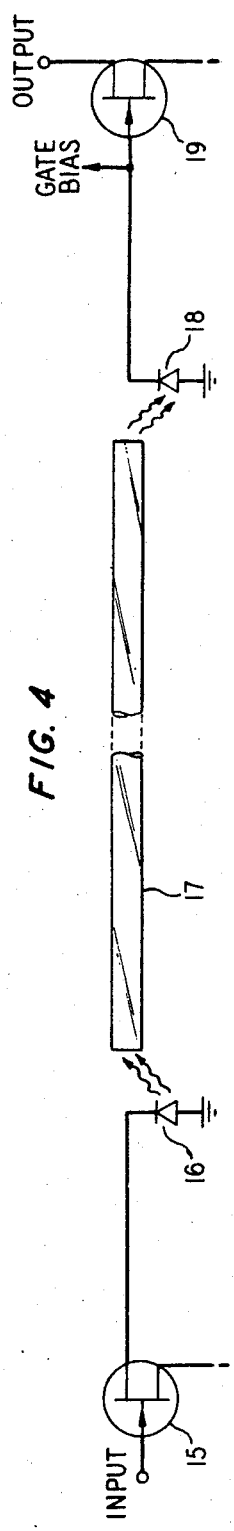
FIG. 4 is a schematic diagram of the apparatus shown in FIGS. 2 and 3.

A schematic diagram of the type circuit that is provided by elements 15–19 in FIG. 1 is illustrated in FIG. 4. As indicated in FIG. 4, an electrical signal is connected to the gate of the field effect transistor whose source is biased and drain is connected by way of a conductor to a light emitting diode 16. The light generated by diode 16 is transmitted by way of waveguide 17 to a photodetector 18 which couples an electrical signal to the gate of a second field effect transistor 19. The train of FET 19 is biased and its source provides the output signal that may be used in the second area of the semiconductor chip.

In accordance with the present invention, the functions illustrated in FIG. 4 are provided by way of a multilayered optical integrated circuit illustrated in FIG. 2. The fabrication of the device shown in FIG. 2 is accomplished in accordance with the table set forth in FIG. 5 using procedures to be described hereinafter. Briefly, the primary layer 207 is fabricated with a bandgap that is suitable for the generation of optical energy. Due to the tapered shape of the primary layer 210 and cladding layer 211 above it in the device shown in FIG. 2, some of the optical energy from layer 207 is coupled into layer 210 which in turn serves as a waveguide between two sections of the multilayered optical integrated circuit. At the remote end of primary layer 210, a similar taper in layer 210 and cladding layer 211 is used to reflect the guided optical energy down through the layers of the device in FIG. 2 to a primary layer 205 which is fabricated to have a bandgap that is lower than either of the other two bandgaps and, therefore, can serve as a detector of the optical energy. As indicated in FIG. 5, the primary layers that provide emission, detection and guidance are surrounded by secondary layers having higher bandgap energies and therefore lower indexes of refraction.

Fabrication of the device begins by growing the epitaxial layers 202–211 shown in FIG. 2 and specified in FIG. 5 on an indium phosphide substrate 201. The doping thickness and composition of each of the layers are set forth in FIG. 5. This growth may be performed by using liquid phase epitaxy using standard semiconductor growth techniques. As indicated in FIG. 5, the wafer which results consists of alternating p-type and n-type layers and groups of layers with varying thickness and varying chemical compositions to achieve the different bandgap energies.

Figure 3:
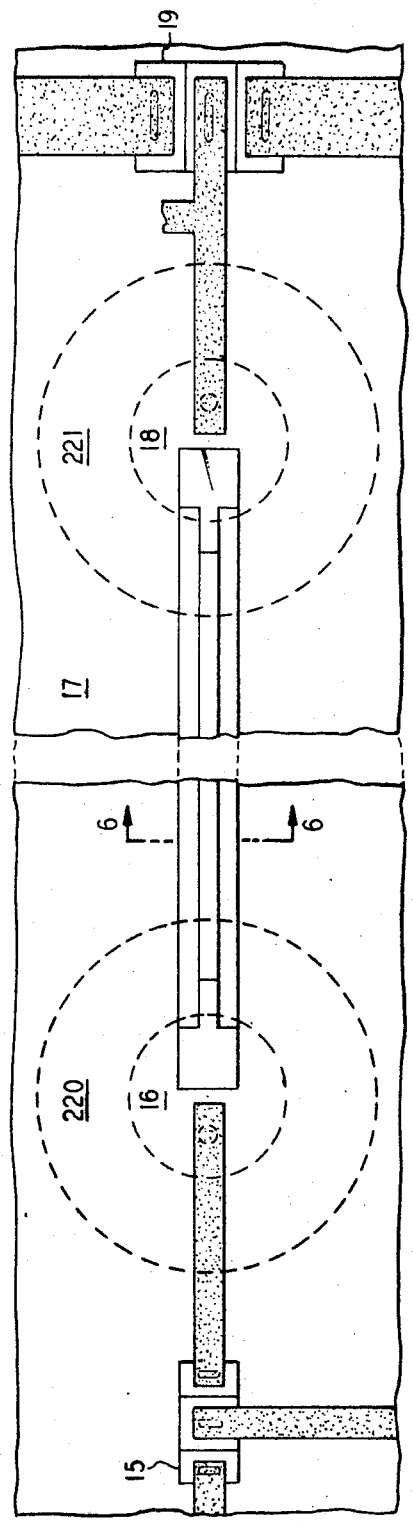
FIG. 3 is a top view of the apparatus shown in FIG. 2.

In the embodiment disclosed the regions of the device which are to be used for optical emission and detection are then isolated by diffusing zinc through a mask to create regions of n-type layers that are completely surrounded by p-type material. These regions are illustrated in FIG. 2 as regions 220 and 221. The structure of these regions is further illustrated in FIG. 3 which is a top view of the device shown in FIG. 2. As indicated in FIG. 3, the zinc doped regions are essentially donut in shape and are diffused to the depth of buffer layer 203 as indicated in FIG. 2.

Figure 6:
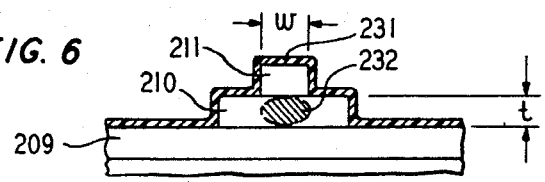
FIG. 6 is a cross-sectional diagram of the waveguide portion of the semiconductor chip shown in FIGS. 2 and 3.

To understand the necessity for the next steps in the processing of the semiconductor chip, it is helpful to first understand a feature of the present invention which relates to a unique method of guiding the light waves from one area of the chip to another. This unique method involves a ridge-loaded waveguide structure of the type shown in FIG. 6. As indicated in FIG. 6, layer 210 is of finite width relative to layer 209 and the light is guided in layer 210 only under the region of 210 that is loaded by the top cladding layer 211. To confine the guided light to a single mode, the thickness, t, of layer 210 is chosen in the present embodiment to be equal to 0.5 micrometers. In the present embodiment where layers 209 and 211 are fabricated of indium phosphide, the index of refraction of these layers is approximately equal to 1.35. Using equations from the slab mode theory of waveguided propagation, the index of refraction for layer 210 can be computed and this index determines the composition of layer 210 set forth in FIG. 5. Using the equations from the paper by H. W. Kogelnik in the book entitled *Integrated Optics* by T. Tamir, Springer-Verlag, 1975, pages 23–24, the minimum value of thickness which will support single mode propagation in this type of waveguide can be computed. In the present instance where the layers have the composition set forth in FIG. 5, this minimum value of thickness is approximately equal to 0.3 micrometers. The value for the width, w, of the ridge-loading cladding layer 211 which will limit propagation to a single mode, can best be determined by experimentation, but theory predicts that this width will fall in the range of 2–5 micrometers.

With the parameter set forth hereinabove for layers 209, 210 and 211, the light can be deflected out of the waveguide to a lower level on the semiconductor chip by etching a taper as shown in FIG. 2 down through the layers 210 and 211. If the taper is cut entirely through layer 210, the light will be reflected by total internal reflection. It should be noted, however, that the taper need only cut down through layer 211 and at least into layer 210 to a thickness that is approximately equal to one half of the thickness necessary to support single mode propagation. Layer 210 need only be wide enough to give a region on each side of layer 211 equal to about the width of layer 211.

After growth of the semiconductor layers shown in FIG. 2 and implantation of the zinc doped regions 220 and 221, processing of the semiconductor chip can then continue by forming layers 210 and 211 into the ridge-type structures shown in FIG. 6. These ridge-waveguide stripes for layers 210 and 211 are then fabricated by using photolithography to mask the stripe areas, and then using a combination of reactive-ion plasma etching or chemical etching to etch through layers 210 and 211. Another photolithography step is then used to mask all of the wafer except areas near the tips of the light guide stripes. A chemical etch is then used which produces a tapered end on layers 210 and 211 and therefore provides optical coupling between the tips of the light guide and the source and detector layers beneath.

Because of the bandgap differences of the various layers it is possible to use selective etchants that etch quickly through one type of layer and slow down appreciably when the next layer is reached. There are several references that can guide the fabricator of the device in the performance of these steps. See, for example, *J. Electrochem. Soc.: Solid-State Science and Technology,* Vol. 126, No. 2, February 1979, "Material-Selective Chemical Etching in the System InGaAsP/InP," by S. B. Phatak et al, pp. 286–292; *Japanese Journal of Applied Physics,* Vol. 19, No. 1, January 1980, "Chemical Etching of Inp and GaInAsP For Fabricating Laser Diodes and Integrated Optical Circuits," by T. Kambayash et al, pp. 79–85; *J. Electrochem. Soc.: Solid State Science,* Vol. 118, No. 5, May 1971, "Selective Etching of Gallium Arsenide Crystals in $H_2SO_4$-$H_2O_2$-$H_2O$ System," by S. Lida, pp. 768–771.

A photolithographic mask is then used to cover all areas except those where the next layer, 209 in FIG. 2, is to be removed. Layers 209, 210 and 211 are then removed where they are exposed. A new photolithographic mask is then used to cover all areas except where the next layer, 208 in FIG. 2, is to be removed, and layer 208 is then etched away where exposed.

This process is repeated for the remaining layers, 207 through 202 in FIG. 2.

An insulating dielectric film 231 such as 3000 Å of SiO is then deposited over the wafer and is covered by a photolithographic mask except where holes are desired for making electrical contact to the semiconductor layers at points exposed by the previous etching steps. These holes are etched in the dielectric, and metal conducting films 212 and 213 (a composite of 1000 Å of chrome and 4000 Å of gold) are evaporated over the wafer. A photolithographic mask is then used to cover the metal stripes used for electrical interconnection and the metal outside these stripes is etched away.

The wafer is then heat-treated (alloyed) to improve the ohmic contact between metal and semiconductor. The individual chips are finally separated and mounted in packages.

What has been described hereinabove is merely an illustrative embodiment of the present invention. Numerous departures may be made by those skilled in the art without departing from the scope of the present invention. For example, the top cladding layer 211 may be entirely absent especially in those cases where the primary guiding layer 210 is expected to guide more than a single mode. In those cases, primary layer 210 may be exposed to the air or covered by the oxide film 231.

What is claimed is:

1. In an electro-optic integrated circuit wherein light is generated, guided and detected, a substrate having a plurality of epitaxial layers grown thereon, at least three of said plurality of epitaxial layers being primary layers, a first primary layer being grown with a bandgap suitable for optical detection, a second primary layer being grown with a wider bandgap suitable for the generation of light that can be detected by said first primary layer, and a third primary layer being grown with a bandgap that is larger than the bandgap of either of said first or second primary layers, said first, second and third primary layers having at least one barrier layer between adjacent primary layers with a bandgap greater than either of said adjacent primary layers.

2. In an electro-optic integrated circuit as defined in claim 1 wherein said first primary layer is the closest primary layer to said substrate, and said third primary layer is the primary layer that is furthest removed from said substrate.

3. In an electro-optic integrated circuit as defined in claim 2 wherein said plurality of epitaxial layers includes a narrow stripe layer formed as a ridge over said third primary layer.

4. An electro-optic integrated circuit as defined in claim 1 wherein said substrate is composed primarily of indium and phosphorous, and said epitaxial layers are composed primarily of elements chosen from the group of indium, phosphorous, gallium and arsenic.

5. In an electro-optic integrated circuit as defined in claim 4 wherein said plurality of epitaxial layers grown on said substrate includes at least two epitaxial layers adjacent to said substrate that are grown with doping characteristics that are suitable for the fabrication of electrical devices.

6. An electro-optic integrated circuit as defined in claim 5 wherein said epitaxial layers adjacent to said substrate include at least one layer grown to provide intrinsic doping.

7. An electro-optic integrated device comprising a substrate having a plurality of epitaxial layers grown thereon, at least three of said plurality of epitaxial layers being primary layers, a first primary layer being grown with a bandgap suitable for optical detection, a second primary layer being grown with a wider bandgap suitable for the generation of light that can be detected by said first primary layer, and a third primary layer being grown with a bandgap that is larger than the bandgap of either of said first or second primary layers, at least two regions of said plurality of layers being electrically isolated, a first electrode means for establishing an electrical connection to the first primary layer in one of said two regions, and a second electrode means for establishing an electrical connection to the second primary layer in a second of said at least two regions, said first, second and third primary layers having at least one barrier layer between adjacent primary layers with a bandgap greater than either of said adjacent primary layers.

8. An electro-optic integrated device as defined in claim 7 wherein said first primary layer is the primary layer that is closest to said substrate, and said third primary layer is the primary layer that is furthest removed from said substrate.

9. An electro-optic integrated device as defined in claim 8 wherein said plurality of epitaxial layers includes a stripe layer formed as a ridge over said third primary layer, the width of said stripe layer being selected to confine the light guided in said third primary layer to a predetermined number of modes.

10. An electro-optic integrated device as defined in claim 9 wherein said stripe layer and said third primary layer terminate at least at one point in a taper that results in the deflection of light guided within said third primary layer toward the lower epitaxial layers of said electro-optic integrated circuit.

11. An electro-optic integrated device as defined in claim 10 wherein said at least two regions are electrically isolated by a dopant that has been diffused into the epitaxial layers of said device, and the taper that terminates said stripe layer and said third primary layer is within at least one of said two regions.

12. An electro-optic integrated device as defined in claim 7 wherein said substrate is composed primarily of indium and phosphorous, and said epitaxial layers are composed primarily of elements chosen from the group of indium, phosphorous, gallium and arsenic.

13. In an electro-optic integrated device as defined in claim 12 wherein said plurality of epitaxial layers grown on said substrate includes at least two epitaxial layers adjacent to said substrate that are grown with doping characteristics that are suitable for the fabrication of electrical devices.

14. An electro-optic integrated device as defined in claim 13 wherein said epitaxial layers adjacent to said substrate include at least one layer grown to provide intrinsic doping.

15. In an optical integrated device wherein light must be guided from one area of the device to another, at least three epitaxial layers grown on a substrate adjacent to each other, the middle of said three adjacent epitaxial layers having a bandgap that is less than either of the adjacent epitaxial layers and a width that is finite in dimensions relative to the wavelength of light propagating in said middle epitaxial layer, and one of the outer layers of said three adjacent epitaxial layers having a width that is less than the finite width of said middle layer and selected to limit the light guided in said middle layer to a predetermined number of optical modes.

* * * * *